United States Patent
Yano et al.

(10) Patent No.: US 8,641,930 B2
(45) Date of Patent: Feb. 4, 2014

(54) IN—GA—ZN TYPE OXIDE SPUTTERING TARGET

(75) Inventors: Koki Yano, Chiba (JP); Masayuki Itose, Chiba (JP); Mami Nishimura, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 178 days.

(21) Appl. No.: 13/264,457

(22) PCT Filed: Nov. 18, 2010

(86) PCT No.: PCT/JP2010/006758
§ 371 (c)(1),
(2), (4) Date: Nov. 30, 2011

(87) PCT Pub. No.: WO2011/061936
PCT Pub. Date: May 26, 2011

(65) Prior Publication Data
US 2012/0093712 A1  Apr. 19, 2012

(30) Foreign Application Priority Data
Nov. 19, 2009 (JP) .................. 2009-264085

(51) Int. Cl.
*H01B 1/02* (2006.01)
*H01B 1/08* (2006.01)

(52) U.S. Cl.
USPC .................... 252/518.1; 204/298.12; 428/432

(58) Field of Classification Search
USPC .................... 252/518.1; 204/298.12; 428/432
See application file for complete search history.

(56) References Cited

U.S. PATENT DOCUMENTS

| | | | |
|---|---|---|---|
| 5,622,653 A | 4/1997 | Orita et al. | |
| 5,681,671 A | 10/1997 | Orita et al. | |
| 5,843,341 A | 12/1998 | Orita et al. | |
| 5,955,178 A | 9/1999 | Orita et al. | |
| 5,972,527 A | 10/1999 | Kaijou et al. | |
| 2004/0180217 A1 | 9/2004 | Inoue et al. | |
| 2004/0222089 A1 | 11/2004 | Inoue et al. | |
| 2008/0308774 A1 | 12/2008 | Inoue et al. | |
| 2009/0189153 A1 | 7/2009 | Iwasaki et al. | |
| 2009/0325341 A1 | 12/2009 | Itagaki et al. | |
| 2010/0108502 A1 | 5/2010 | Inoue et al. | |
| 2010/0289020 A1 | 11/2010 | Yano et al. | |

FOREIGN PATENT DOCUMENTS

| | | |
|---|---|---|
| JP | 63-239117 A | 10/1988 |
| JP | 6-234565 A | 8/1994 |
| JP | 8-245220 A | 9/1996 |
| JP | 2007-73312 A | 3/2007 |
| JP | 2007-281409 A | 10/2007 |
| JP | 2008-53356 A | 3/2008 |

(Continued)

OTHER PUBLICATIONS

International Search Report of PCT/JP2010/006758 (Dec. 6, 2010).

(Continued)

*Primary Examiner* — Khanh Tuan Nguyen
(74) *Attorney, Agent, or Firm* — Millen, White, Zelano & Branigan, P.C.

(57) ABSTRACT

A sputtering target including oxide A shown below and indium oxide ($In_2O_3$) having a bixbyite crystal structure:
Oxide A: an oxide which includes an indium element (In), a gallium element (Ga) and a zinc element (Zn) in which diffraction peaks are observed at positions corresponding to incident angles (2θ) of 7.0° to 8.4°, 30.6° to 32.0°, 33.8° to 35.8°, 53.5° to 56.5° and 56.5° to 59.5° in an X-ray diffraction measurement (CuKα rays).

20 Claims, 4 Drawing Sheets

(56) References Cited

FOREIGN PATENT DOCUMENTS

| JP | 2008-163442 A | 7/2008 |
|----|---------------|--------|
| JP | 2008-280216 A | 11/2008 |
| JP | 2008-285760 A | 11/2008 |
| JP | 4318689 B2 | 6/2009 |
| WO | WO 2009/075281 A1 | 6/2009 |
| WO | WO 2009/084537 A1 | 7/2009 |
| WO | WO 2009/148154 A1 | 12/2009 |

OTHER PUBLICATIONS

Partial Translation of the Written Opinion of the International Searching Authority.

IN—GA—ZN TYPE OXIDE SPUTTERING TARGET

TECHNICAL FIELD

The invention relates to a sputtering target used for forming an oxide thin film such as an oxide semiconductor and a transparent conductive film or the like.

BACKGROUND ART

An amorphous oxide film composed of indium oxide and zinc oxide, or indium oxide, zinc oxide and gallium oxide has attracted attention as a transparent conductive film or a semiconductor film (used in a thin film transistor or the like) since it has transmittance to visible rays and a wide range of electric properties from a conductor or a semiconductor to an insulator.

In particular, since an n-type semiconductor material containing indium oxide and zinc oxide has been found by Hosokawa et al., (Patent Document 1), various oxide semiconductors containing indium oxide and zinc oxide have attracted attention.

As the method for forming the above-mentioned oxide film, a physical film-forming method such as sputtering, pulse laser deposition (PLD) and deposition or a chemical film forming method such as a sol-gel method have been studied. Of these methods, a physical film-forming method such as sputtering has been mainly studied since a film can be uniformly formed in a large area at a relatively low temperature.

When forming an oxide thin film by the above-mentioned physical film-forming method, it is common to use a target formed of an oxide sintered body in order to form a uniform film stably and efficiently (at a high film-forming speed).

As the target for forming the above-mentioned oxide film (mainly, a sputtering target), studies have been mainly made on one having a composition of a known crystal form such as $In_2O_3(ZnO)_m$ (m=2 to 20), $InGaZnO_4$ and $In_2Ga_2ZnO_7$ or one having a composition close to that of these crystal forms.

Specifically, a target which is formed of a sintered body of an oxide which comprises mainly In and Zn and contains a hexagonal compound represented by the general formula $In_2O_3(ZnO)_m$ (m=2 to 20) or a target obtained by doping this oxide with at least one kind of an element having a valency of positive trivalency or higher in an amount of 20 at.% or less is disclosed (Patent Document 2).

Further, a target having a crystal structure of a hexagonal compound such as $InGaZnO_4$ and $In_2Ga_2ZnO_7$ (homologous crystal structure) has been studied (Patent Documents 3, 4 and 5).

Further, studies have been made on development of a target utilizing the properties of a mixture. For example, development of a target formed of a mixture of a hexagonal compound represented by $In_2O_3(ZnO)_m$ (m=2 to 20) and $In_2O_3$ or a target formed of a mixture of a hexagonal compound represented by $In_2O_3(ZnO)_m$ (m=2 to 20) and ZnO (Patent Document 2), a target formed of a mixture of a hexagonal compound represented by $InGaZnO_4$ and a spinel compound represented by $ZnGa_2O_4$ (Patent Document 6) or the like has been studied.

In addition, Patent Document 7 discloses an oxide represented by $InGaO_3(ZnO)m$ (m=1 to 20) such as $InGaO_3(ZnO)_2$ and a synthesis method thereof.

As for targets, no studies have been made on other oxides than those having the above-mentioned known crystal form, and thin films have been only studied (Patent Documents 3 and 8). Specifically, a thin film formed by a method in which the composition ratio is adjusted during the film formation by co-sputtering or the like has been studied.

Meanwhile, as for oxides which do not have known crystal forms, a change in solubility limit or lattice constant of a sintered body obtained by firing powder raw materials has been reported (Non-Patent Documents 1 and 2). Non-Patent Document 2 gives an example in which calculation is made on the assumption that an oxide having a crystal form represented by $In_{1.5}Ga_{0.5}O_3(ZnO)_m$ is present. However, no specific studies were made on the synthesis of this oxide, application thereof to a sputtering target or the like (Non-Patent Document 2, TABLE IV).

On the other hand, studies have been made on producing various thin film transistors by changing the composition of indium oxide, zinc oxide and gallium oxide (Patent Document 9). However, since studies on targets at each composition were not sufficient, a thin film transistor obtained had a high specific resistance.

In addition, an example was disclosed in which an amorphous oxide semiconductor film and a thin film transistor were formed by using an In—Ga—Zn—O sintered body with a metal composition ratio In:Ga:Zn=30:15:55 (Patent Document 10).

However, there was a problem that the Ga content of a thin film was significantly decreased such that it became about two-third of the Ga content of the target. This suggests improper properties of the target, however, no studies were made on the target properties and the improvement thereof.

RELATED ART DOCUMENTS

Patent Documents

Patent Document 1: Japanese Patent No. 4318689
Patent Document 2: JP-A-H06-234565
Patent Document 3: JP-A-H08-245220
Patent Document 4: JP-A-2007-73312
Patent Document 5: WO2009/084537
Patent Document 6: WO2008/072486
Patent Document 7: JP-A-S63-239117
Patent Document 8: JP-A-2007-281409
Patent Document 9: WO2009-075281
Patent Document 10: JP-A-2008-53356

Non-Patent Documents

Non-Patent Document 1: J. Am. Ceram. Soc., 82 [10] 2705-2710 (1999)
Non-Patent Document 2: Journal of Solid State Chemistry, 93[2] 298-315 (1991)

SUMMARY OF THE INVENTION

An object of the invention is to provide a sputtering target which has a high relative density and a low resistance, is uniform, and is capable of forming good oxide thin films such as an oxide semiconductor and a transparent conductive film.

As a result of intensive studies, the inventors have found an oxide having a novel crystal structure which is different from the crystal form of $In_2O_3(ZnO)_m$ and $InGaO_3(ZnO)_m$ which have conventionally been known. It is assumed that this oxide has a crystal structure which is between a crystal structure represented by $In_2O_3(ZnO)_2$ and a crystal structure represented by $InGaO_3(ZnO)_2$. The inventors have also found that an oxide mixture containing both this new oxide and $In_2O_3$ having a bixbyite crystal structure is suitable as a sputtering target for forming a thin film for an oxide semiconductor. The invention has been made based on this finding.

According to the invention, the following sputtering target or the like are provided.

1. A sputtering target comprising oxide A shown below and indium oxide (In$_2$O$_3$) having a bixbyite crystal structure:

Oxide A: an oxide which comprises an indium element (In), a gallium element (Ga) and a zinc element (Zn) in which diffraction peaks are observed at positions corresponding to incident angles (2θ) of 7.0° to 8.4°, 30.6° to 32.0°, 33.8° to 35.8°, 53.5° to 56.5° and 56.5° to 59.5° in an X-ray diffraction measurement (CuKα rays).

2. The sputtering target according to 1, wherein the atomic ratio of an indium element (In), a gallium element (Ga) and a zinc element (Zn) satisfies the following formulas (1) and (2):

$$0.10 \leq Zn/(In+Ga+Zn) 0.45 \quad (1)$$

$$0.05 < Ga/(In+Ga+Zn) < 0.18 \quad (2).$$

3. The sputtering target according to 1 or 2, wherein the atomic ratio of an indium element (In) and a gallium element (Ga) satisfies the following formula (3):

$$0.14 \leq Ga/(In+Ga) \quad (3).$$

4. The sputtering target according to one of 1 to 3, wherein all mental elements contained consist essentially of In, Ga and Zn.

5. The sputtering target according to one of 1 to 4 which has a resistance of 10 mΩcm or less and a relative density of 95% or more.

6. An oxide thin film produced by using the sputtering target according to one of 1 to 5.

According to the invention, a sputtering target which has a high relative density and a high resistance, and is suitable for forming an oxide semiconductor or an oxide thin film can be provided.

MODE FOR CARRYING OUT THE INVENTION

Figure 1:
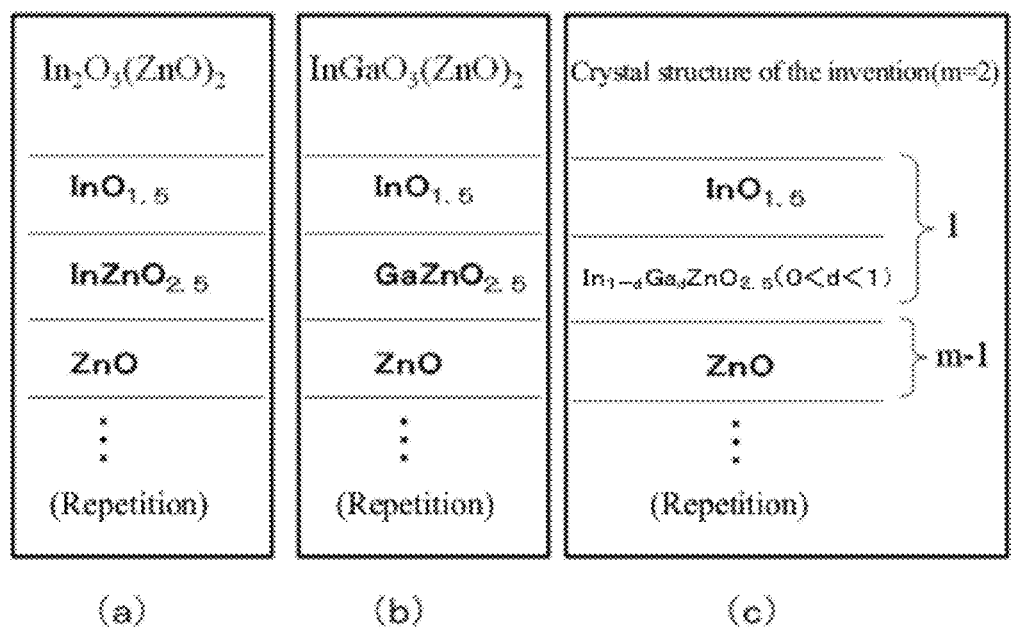
FIG. 1(a) is a conceptual view showing the crystal structure of InGaO$_3$(ZnO)$_2$.
FIG. 1(b) is a conceptual view showing the crystal structure of In$_2$O$_3$(ZnO)$_2$ and FIG. 1(c) is a conceptual view showing the crystal structure of oxide A.

The sputtering target of the invention is characterized in that it is composed of an In—Ga—Zn-based oxide sintered body containing an indium element (In), a gallium element (Ga) and a zinc element (Zn) and has the following both two crystal structures.

Crystal structure 1: oxide A (an oxide containing indium element (In), gallium element (Ga) and a zinc element (Zn), in which diffraction peaks are observed at positions corresponding to incident angles (2θ) of 7.0° to 8.4°, 30.6° to 32.0°, 33.8° to 35.8°, 53.5° to 56.5° and 56.5° to 59.5° in an X-ray diffraction measurement (CuKα rays))

Crystal structure 2: Indium oxide having a bixbyite crystal structure (In$_2$O$_3$)

The above oxide A is a novel crystal structure which has been found by the inventors. In a chart obtained by the X-ray diffraction measurement (CuKα rays), diffraction peaks were observed in the following regions A to E:

A. Incident angle (2θ)=7.0° to 8.4° (preferably 7.2° to 8.2°)

B. Incident angle (2θ)=30.6° to 32.0° (preferably 30.8° to 31.8°)

C. Incident angle (2θ)=33.8° to 35.8° (preferably 34.5° to 35.3°)

D. Incident angle (2θ)=53.5° to 56.5° (preferably 54.1° to 56.1°)

E. Incident angle (2θ)=56.5° to 59.5° (preferably 57.0° to 59.0°)

It is preferred that one of diffraction peaks observed at 2θ=30.6° to 32.0° (the region B) and at 2θ=33.8° to 35.8° (the region C) be a main peak, and the other be a sub peak.

Meanwhile, the main peak is a peak of which the intensity (height) is largest within a range of 2θ of 5° to 80° and the sub peak is a peak of which the intensity is the second largest.

If the main peaks are overlapped, it is possible to conduct inverse operation of the intensity of the main peak from other peaks.

In the invention, the measurement conditions of the X-ray diffraction are as follows, for example.

Apparatus: Ultima-III, manufactured by Rigaku Corporation
X rays: Cu-Kα rays (wavelength:1.5406 Å, monochromized by means of a graphite monochrometer)
2θ-θ reflection method, continuous scanning (1.0°/min)
Sampling interval: 0.02°
Slit DS, SS: 2/3°, RS: 0.6 mm Oxide crystals in which the above-mentioned peaks are observed in a chart obtained by the X-ray diffraction measurement (CuKα rays) are not found in JCPDS (Joint Committee of Powder Diffraction Standards) cards, and are novel crystals which have not been confirmed so far.

The X-ray diffraction charts of oxide A are similar to the crystal structure represented by InGaO$_3$(ZnO)$_2$(JCPDS:40-0252) and the crystal structure represented by In$_2$O$_3$(ZnO)$_2$ (JCPDS:20-1442). However, oxide A has a peak specific to InGaO$_3$(ZnO)$_2$ (a peak in the above-mentioned region A), a peak specific to In$_2$O$_3$(ZnO)$_2$ (a peak in the above-mentioned regions D and E) and a peak which is not observed in InGaO$_3$(ZnO)$_2$ and In$_2$O$_3$(ZnO)$_2$ (a peak in the above-mentioned region B). Therefore, oxide A is different from InGaO$_3$(ZnO)$_2$ and In$_2$O$_3$(ZnO)$_2$.

As for the peak of the above-mentioned region B, this peak exists between the main peaks of In$_2$O$_3$(ZnO)$_2$ and InGaO$_3$(ZnO)$_2$ (i.e., between around 31° and around 32°). Therefore, this peak shifts to the lower angle side than the main peak of InGaO$_3$(ZnO)$_2$ (it appears that the lattice spacing is increased), and this peak shifts to the higher angle side than the main peak of In$_2$O$_3$(ZnO)$_2$ (it appears that the lattice spacing is decreased).

It appears that the crystal structure of oxide A is similar to the crystal structure of InGaO$_3$(ZnO)$_2$ (JCPDS: 40-0252) and to the crystal structure of In$_2$O$_3$(ZnO)$_2$ (JCPDS: 20-1442).

FIG. 1(a) shows the crystal structure of InGaO$_3$(ZnO)$_2$, FIG. 1(b) shows the crystal structure of In$_2$O$_3$(ZnO)$_2$ and FIG. 1(c) shows the assumed crystal structure of oxide A.

The crystal structure represented by In$_2$O$_3$(ZnO)$_m$ (wherein m is an integer of 1 to 20) or InGaO$_3$(ZnO)$_m$ (wherein m is an integer of 1 to 20) is called the "hexagonal compound" or the "crystal structure in the homologous phase". This is a crystal which is formed of a "natural superlattice" structure having a long period in which crystal layers of different materials are overlapped one on another. If the crystal period or the thickness of each thin film layer is on the level of nanometer, due to combination of the chemical composition or thickness of each layer, specific properties different from a single substance or a mixed crystal obtained by mixing the layers can be obtained.

The crystal structure of the homologous phase can be confirmed by the fact that the X-ray diffraction pattern measured by using pulverized products or sliced pieces of the target, for example, conforms to the X-ray diffraction pattern of the homologous phase assumed from the composition ratio thereof. Specifically, it can be confirmed from the fact that it conforms to by the X-ray diffraction pattern of the homologous phase obtained from the JCPDS card.

The crystal structure represented by $In_2O_3(ZnO)_m$ (wherein m is an integer of 1 to 20) is thought to have a structure in which the $InO_{1.5}$ layer, the $InZnO_{2.5}$ layer and the ZnO layer are periodically repeated at a ratio of 1:1:(m-1). Further, as for the crystal structure represented by $InGaO_3(ZnO)_m$ (m is an integer of 1 to 20), it is thought that the $InO_{1.5}$ layer, the $GaZn_{2.5}$ layer, and the ZnO layer are periodically repeated at a ratio of 1:1:(m-1).

As mentioned above, as for the measurement results by the X-ray diffraction of the crystal structure represented by $In_2O_3(ZnO)_m$ (m is an integer of 1 to 20) or the crystal structure represented by $InGaO_3(ZnO)_m$ (m is an integer of 1 to 20), these structures have similar patterns although the peak positions thereof are different (that is, lattice spacing is different).

It is assumed that the crystal structure of oxide A is, as in the case of $In_2O_3(ZnO)_m$ or $InGaO_3(ZnO)_m$ mentioned above, a crystal structure formed of the "hexagonal compound" or the "crystal structure in the homologous structure". Oxide A of the invention has both a peak specific to $InGaO_3(ZnO)_2$ (peak in the above-mentioned region A) and a peak specific to $In_2O_3(ZnO)_2$ (peak in the above-mentioned regions D and E) in combination. From the fact, it can be thought that a layer represented by $In_{1-d}Ga_dZnO_{2.5}$ (0<d<1), which is different from the $InZnO_{2.5}$ layer and the $GaZnO_{2.5}$ layer, is generated. That is, it can be assumed that it is a structure in which the $InO_{1.5}$ layer, the $In_{1-d}Ga_dZnO_{2.5}$ (0<d<1) layer and the ZnO layer are periodically repeated at a ratio of 1:1:(m-1).

Further, it can be thought that the $In_{1-d}Ga_dZnO_{2.5}$ layer (0<d<1) is a state in which the $InZnO_{2.5}$ layer and the $GaZnO_{2.5}$ layer are mixed, a state in which part of In in the $InZnO_{2.5}$ layer is substituted by Ga or a layer having a new structure containing In, Ga, Zn and O.

In oxide A, if it has a diffraction pattern specific to the invention by the X-ray diffraction measurement, the amount of oxygen in the oxide may be excessive or insufficient (oxygen deficiency) (the atomic ratio of the oxygen element may be deviated from the chemical stoichiometric ratio). If the amount of oxygen in the oxide is excessive, the resistance may be too high when it is formed into a target. Therefore, it is preferred that the oxide have oxygen deficiency.

Indium oxide ($In_2O_3$) having a bixbyite crystal structure (crystal structure 2) is identified since it has a diffraction peak corresponding to No. 06-0416 of the JCPDS card in the X-ray diffraction measurement.

It is preferred that the content (at. %) of the above-mentioned crystal structure 1 in the sputtering target be 30% to 70%, in particular, 40% to 60%. In addition, it is preferred that the content of the above-mentioned crystal structure 2 be 30 to 70%, in particular, 40% to 60%.

The sputtering target of the invention may have a crystal structure other than crystal structure 1 and crystal structure 2 mentioned above. For example, depending on conditions during the firing step of a target, a target may contain a crystal structure such as $In_2O_3(ZnO)_3$ and $InGaZn_4$. However, in order to obtain the advantageous effects of the invention, it is preferred that one of crystal structure 1 and crystal structure 2 be a main component ($1^{st}$ component) and the other be a sub component ($2^{nd}$ component). In particular, it is preferred that the total of the contents of crystal structure 1 and crystal structure 2 be 90% or more, preferably 95% or more. It may be 100%.

The content of each crystal can be calculated from the intensity ratio of diffraction peaks of the X-ray diffraction chart.

As for the elemental composition of the sputtering target of the invention, it is preferred that the atomic ratio of an indium element (In), a gallium element (Ga) and a zinc element (Zn) satisfy the following formulas (1) and (2):

$$0.10 \leq Zn/(In+Ga+Zn) \leq 0.45 \quad (1)$$

$$0.05 < Ga/(In+Ga+Zn) < 0.18 \quad (2)$$

As for the above-mentioned formula (1), if the ratio of Zn is less than 0.10 or exceeds 0.45, the resistance of the target may be increased.

The ratio of Zn is further preferably 0.25 to 0.42, with 0.30 to 0.40 being particularly preferable. Within this range, it is easy to prepare a target which contains both oxide A and a bixbyite structure represented by $In_2O_3$.

As for the above-mentioned formula (2), if the ratio of Ga is 0.05 or less, the moisture resistance of the resulting oxide thin film may be lowered, or the wet etching speed may become too high when a thin film transistor (semiconductor thin film) is prepared. On the other hand, if the ratio of Ga is 0.18 or more, the resistance of the target may be high or the mobility may be lowered when a thin film transistor (semiconductor thin film) is prepared.

It is preferred that the ratio of Ga be 0.10 to 0.17, more preferably 0.12 to 0.16.

If the ratio of Ga is close to 0.13, it is possible to allow crystals of oxide A to be generated easily.

It is preferred that the elemental composition of the sputtering target of the invention satisfy the following formula (3):

$$0.14 \leq Ga/(In+Ga) \quad (3)$$

In the formula (3), it is preferred that the upper limit of Ga be 0.35 or less.

The atomic ratio of the each element contained in the target or the oxide thin film of the invention can be obtained by quantitatively analyzing the elements contained by Inductively Coupled Plasma Atomic Emission Spectroscopy (ICP-AES).

Specifically, in an analysis using ICP-AES, a sample solution is atomized by means of a nebulizer, and then introduced into argon plasma (about 6000 to 8000° C.). The elements in the sample are excited by absorbing thermal energy, whereby orbit electrons are transferred from the ground state to an orbit with a higher energy level. These orbit electrons are transferred to an orbit with a lower energy level within about $10^{-7}$ to $10^{-8}$ seconds. At this time, difference in energy is radiated as light to cause emission. Since this light has a wavelength (spectral line) peculiar to the element, the presence of the element can be confirmed by the presence of the spectral line (qualitative analysis).

Further, since the amplitude of each of the spectral line (emission intensity) increases in proportion to the number of elements contained in a sample, the concentration of a sample solution can be obtained by comparing a sample solution with a standard solution with a known concentration (quantitative analysis).

After identifying the element contained by a qualitative analysis, the content thereof is obtained by a quantitative analysis. From the results, the atomic ratio of each element is obtained.

In the invention, other metal elements than In, Ga and Zn, as mentioned above, e.g. Sn, Ge, Si, Ti, Zr, Hf or the like, may be contained in an amount which does not impair the advantageous effects of the invention.

In the invention, the metal elements contained in the target may essentially consist of In, Ga and Zn. The "essentially" means that no other than elements than impurities or the like which are originally contained in raw materials or inevitably mixed in during the production process or the like are not contained.

The target of the invention can be produced by sintering raw material powder containing each metal element, for example. The production process will be explained hereinbelow.

(1) Mixing Step

Mixing of raw materials is an essential step of mixing compounds of metal elements contained in the oxide of the invention.

As the raw material, powders such as powder of an indium compound, powder of a gallium compound, powder of a zinc compound or the like are used. As the compound of indium, indium oxide, indium hydroxide or the like can be given, for example. As the compound of zinc, zinc oxide, zinc hydroxide or the like can be given, for example. As for the compound of each element, an oxide is preferable since sintering can be conducted easily and bi-products are hardly remained.

As for the purity of the raw material, the purity is normally 2N (99 mass %) or more, preferably 3N (99.9 mass %) or more, with 4N or more (99.99 mass %) being particularly preferable. If the purity is lower than 2N, the durability may be lowered, or burn-in may occur due to entering of impurities to the liquid crystal.

It is preferred that metal zinc (zinc powder) be used as part of the raw material. By using zinc powder as part of the raw material, generation of white spots can be suppressed.

It is preferred that raw materials such as metal oxides used for the production of a target be mixed and be uniformly mixed and pulverized by means of a common pulverizer, e.g. a wet ball mill, a bead mill or an ultrasonic apparatus.

When an oxide is used as the raw material, the specific surface area (BET specific surface area) of indium oxide, gallium oxide and zinc oxide is normally 3 to 18 $m^2/g$, 3 to 18 $m^2/g$ and 3 to 18 $m^2/g$, respectively, preferably 7 to 16 $m^2/g$, 7 to 16 $m^2/g$ and 3 to 10 $m^2/g$, respectively, more preferably 7 to 15 $m^2/g$, 7 to 15 $m^2/g$ and 4 to 10 $m^2/g$, and particularly preferably 11 to 15 $m^2/g$, 11 to 15 $m^2/g$ and 4 to 5 $m^2/g$. If the specific surface area is too small, an aggregate of each element may grow within the sintered body, the crystal form of the raw material powder may remain, an unexpected crystal form may be generated to cause the properties to change, or the like. If the specific surface area is too large, an unexpected crystal form may be generated to cause the properties to change and insufficient dispersion may occur to cause poor appearance or un-uniformity in properties.

(2) Pre-Firing Step

A pre-firing step is a step optionally provided in which the mixture obtained in the above-mentioned step is pre-fired. By the pre-firing step, although the density of the oxide can be easily increased, the production cost may also be increased. Therefore, it is more preferred that the density be increased without conducting pre-firing.

In the pre-firing step, it is preferred that the above-mentioned mixture be heat-treated at 500 to 1200° C. for 1 to 100 hours. If a heat treatment is conducted at less than 500° C. or for shorter than 1 hour, thermal decomposition of an indium compound, a zinc compound or a tin compound may be insufficient. If the heat treatment is conducted at a temperature higher than 1200° C. or for longer than 100 hours, coarsening of particles may occur.

Therefore, it is particularly preferred that a heat treatment (pre-firing) be conducted at a temperature range of 800 to 1200° C. for 2 to 50 hours.

It is preferred that a pre-fired product obtained in this step be pulverized before the following shaping and firing steps. It suffices that pulverizing be conducted until the average particle diameter (D50) becomes preferably 2 μm or less, more preferably 1 μm or less and particularly preferably 0.5 μm or less. The purpose of pulverizing is to attain uniform dispersion of the raw materials. If raw material powder having a large particle size is present, unevenness in composition may occur according to places. Such unevenness in composition according to places may result in abnormal discharge during sputtering. Further, unevenness in composition may cause a difference in composition between the target and the formed thin film.

(3) Shaping Process

A shaping step is an essential step in which the mixture obtained in the above-mentioned mixing step (the pre-fired product, if the above-mentioned pre-firing step is provided) is pressure-formed into a shaped body. By this step, the mixture or the pre-fired product is shaped into a shape which is preferable as a target. When a pre-firing step is provided, after fine powder of the resulting pre-fired product is pulverized, it can be shaped into a desired shape by a shaping process.

As for a shaping process, press shaping (uniaxial shaping), die shaping, cast shaping, inject shaping or the like can be mentioned, for example. In order to obtain a target having a high sintered density, it is preferable to conduct shaping by cold isostatic pressing (CIP).

If shaping is conducted simply by press shaping (uniaxial pressing), unevenness in pressure may occur, whereby an unexpected crystal form may be generated.

Further, after press shaping (uniaxial pressing), it is preferable to conduct cold isostatic pressing (CIP), hot isostatic pressing (HIP) or the like, i.e. to provide two or more steps of shaping.

When CIP (cold isostatic pressing or hydrostatic pressure apparatus) is used, it is preferable to hold at a surface pressure of 800 to 4,000 $kgf/cm^2$ for 0.5 to 60 minutes, and it is more preferable to hold at a surface pressure of 2,000 to 3,000 $kgf/cm^2$ for 2 to 30 minutes. Within the above-mentioned range, it is expected that unevenness in composition or the like within the shaped body is decreased, whereby a homogenized sintered body can be obtained. Further, if the surface pressure is less than 800 $kgf/cm^2$ or less, the density after sintering may not be increased or the resistance may be increased. If the surface pressure exceeds 4000 $kgf/cm^2$ or more, the apparatus may become too large to cause an economical disadvantage. If the holding time is less than 0.5 minute, the density after sintering may not be increased or the resistance may become high. A holding time of exceeding 60 minutes may be economically disadvantageous since a too long period of time is taken.

In the shaping, a shaping aid such as polyvinyl alcohol, methyl cellulose, polywax, oleic acid or the like may be used.

(4) Firing Step

A firing step is an essential step in which the shaped body obtained in the above-mentioned shaping step is fired.

Firing can be conducted by hot isostatic pressing (HIP) or the like.

As for firing conditions, firing is normally conducted in an oxygen gas atmosphere or under an oxygen gas pressure at 1100 to 1600° C. for normally 30 to 360 hours, preferably 8 to 180 hours, more preferably 12 to 96 hours.

If the firing temperature is lower than 1100° C., the density of the target may hardly increase or a long time may be taken for sintering. If the firing temperature exceeds 1600° C., the composition may be changed or a furnace may be deteriorated by the evaporation of components.

If the firing time is shorter than 30 minutes, the density of the target may hardly be increased, and if the firing time is longer than 360 hours, the production takes a too long time to result in an increase in cost, and hence, such a long firing time cannot be used on the practical basis.

If firing is conducted in an atmosphere which does not contain oxygen or at a temperature higher than 1600° C., the density of the resulting target cannot be improved sufficiently, and generation of abnormal discharge during sputtering cannot be fully suppressed.

During firing, the temperature is elevated normally at a rate of 8° C./min or less, preferably 4° C./min or less, more preferably 2° C./min or less, further preferably 1° C./min or less and particularly preferably 0.5° C./min or less. If the temperature is elevated at a rate of 8° C./min or less, the crystal form of the invention can be easily obtained. Further, when elevating temperature, cracks hardly occur.

During firing, the temperature is lowered normally at a rate of 4° C./min or less, preferably 2° C./min or less, more preferably 1° C./min or less, further preferably 0.8° C./min or less, and particularly preferably 0.5° C. or less. If the temperature is lowered at a rate of 4° C./min or less, the target of the invention can be obtained easily. Further, when cooling, cracks hardly occur during cooling.

(5) Reduction Step

A reduction step is a step which is optionally provided according to need in order to homogenize the bulk resistance of the sintered product obtained in the above-mentioned firing step in the entire target.

As for the reduction method which can be applied in this step, reduction using a reductive gas, reduction by vacuum firing, reduction with an inert gas or the like can be given.

In the case of a reduction treatment with a reductive gas, hydrogen, methane, carbon monoxide or a mixed gas with these gases and oxygen, or the like can be used.

In the case of a reduction treatment by firing in an inert gas, nitrogen, argon, or a mixed gas with these gases and oxygen, or the like can be used.

Reduction is normally conducted at a temperature of 100 to 800° C., preferably 200 to 800° C. The reduction is normally conducted for 0.01 to 10 hours, preferably 0.05 to 5 hours.

By each of the above steps, an oxide sintered body containing both crystal structure 1 and crystal structure 2 as mentioned above can be obtained. This oxide sintered body has a high relative density, a high resistance, a high transverse rupture strength and a high uniformity, and hence, is suitable as a target for forming an oxide thin film such as an oxide semiconductor and a transparent conductive film.

By processing the above-mentioned oxide sintered body of the invention into a desired shape according to need, a final product can be obtained.

Processing is conducted in order to cut the above-mentioned oxide sintered body into a shape which is suitable for mounting on a sputtering apparatus, as well as to provide a mounting jig such as a backing plate. In order to form an oxide sintered body to be a sputtering target, the sintered body is ground by means of a plane grinder to allow the surface roughness Ra to be 5 μm or less. Further, the sputtering surface of the target may be subjected to mirror finishing, thereby allowing the average surface roughness thereof Ra to be 1000 Å or less. For this mirror finishing (polishing), known polishing techniques such as mechanical polishing, chemical polishing, mechano-chemical polishing (combination of mechanical polishing and chemical polishing) or the like may be used. For example, it can be obtained by polishing by means of a fixed abrasive polisher (polishing liquid: water) to attain a roughness of #2000 or more, or can be obtained by a process in which, after lapping by a free abrasive lap (polisher: SiC paste or the like), lapping is conducted by using diamond paste as a polisher instead of the SiC paste. There are no specific restrictions on these polishing methods.

The resulting sputtering target is bonded to a backing plate. The thickness of the target is usually 2 to 20 mm, preferably 3 to 12 mm, and particularly preferably 4 to 6 mm. Further, it is possible to mount a plurality of targets on a single backing plate to use them as substantially a single target.

After polishing, the target is cleaned. For cleaning, air blowing, washing with running water or the like can be used. When foreign matters are removed by air blowing, foreign matters can be removed more effectively by air intake by means of a dust collector from the side opposite to the air blow nozzle. Since the above-mentioned air blow or washing with running water has its limit, ultrasonic cleaning or the like can also be conducted. In ultrasonic cleaning, it is effective to conduct multiplex oscillation within a frequency range of 25 to 300 kHz. For example, it is preferable to perform ultrasonic cleaning every 25 kHz in a frequency range of 25 to 300 kHz by subjecting 12 kinds of frequency to multiplex oscillation.

The sputtering target of the invention preferably has a relative density of 95% or more, more preferably 96% or more, and particularly preferably 97% or more. If the relative density is less than 95%, the target may tend to be broken easily or abnormal discharge may occur easily.

The relative density is a density which is calculated relatively to the theoretical density which has been calculated from the weighted average. The density calculated from the weighted average of the density of each of the raw materials is the theoretical density, which is taken as 100%.

The resistance of the target is preferably 0.01 mΩcm or more and 10 mΩcm or less, more preferably 0.1 mΩcm or more and 5 mΩcm or less, and particularly preferably 0.2 mΩcm or more and 3 mΩcm or less. When the resistance exceeds 10 mΩcm, if DC sputtering is conducted for a long period of time, spark may occur due to abnormal discharge. As a result, the target may be cracked or particles which have been jumped out from the target by spark may adhere to the substrate for film formation, causing performance as the oxide semiconductor film to be lowered. If the resistance is smaller than 0.01 mΩcm, the resistance of the target becomes smaller than the resistance of particles, and abnormal discharge may occur due to the particles which have been jumped out.

It is preferred that the range of a variation of positive elements other than zinc in the target be within 0.5%. If it is within 0.5 wt %, the uniformity of the resistance of the target can be improved (variation can be suppressed). Further, a variation in a formed film can be suppressed.

The range of a variation of a positive element can be obtained by a method in which samples which have been cut from 10 parts of the target are subjected to an analysis by means of ICP-AES.

It is preferred that the range of a variation of relative density in the target be within 3%. If the range of a variation of relative density is within 3%, the uniformity of resistance of the target can be improved (variation can be suppressed). Further, a variation in the formed film can be suppressed.

The variation in relative density is obtained by cutting arbitral 10 parts of the sintered body, obtaining the relative density thereof by the Archimedean Law and calculating from the following formula based on the average value, the maximum value and the minimum value.

Variation in relative density=(Maximum−Minimum)/ Average×100 (%)

The number of pinholes with a Ferret diameter of 2 μm or more in the target is preferably 50 pinholes/mm$^2$ or less, more preferably 20 pinholes/mm$^2$ or less, and further preferably 5 pinholes/mm$^2$ or less. A number of pinholes with a Ferret diameter of 2 μm or more of larger than 50 pinholes/mm$^2$ is not preferable since abnormal discharge may occur frequently from the initial stage to the final stage of using the target. In addition, with that number of pinholes, the smoothness of the resulting sputtering film tends to be lowered. If the number of pinholes with a Ferret diameter of 2 μm or more in the sintered body is 5 pinholes/mm$^2$ or less, occurrence of abnormal discharge can be suppressed from the initial stage to the final stage of using the target. Further, the resulting sputtering film is very smooth.

Here, the Ferret diameter means a distance between parallel lines sandwiching a particle in a fixed direction, if a pinhole is assumed as the particle.

It can be measured by observing an SEM image with a magnification of 100 times, for example.

By sputtering an object such as a substrate by using the sputtering target of the invention, the oxide thin film of the invention can be formed. The oxide thin film can be preferably used in a semiconductor layer, an oxide thin film layer or the like of a thin film transistor.

The film thickness at the time of film formation is preferably 1 to 45 nm, further preferably 3 to 30 nm, with 5 to 20 nm being particularly preferable. By allowing the film thickness to be 45 nm or less, it is expected that a semiconductor having a high mobility and a small S value can be obtained.

EXAMPLES

Example 1

(1) Preparation of an Oxide Sintered Body

As starting materials, In$_2$O$_3$ (manufactured by Nippon Rare Metal, Inc: purity 4N), Ga$_2$O$_3$ (manufactured by Kojundo Chemical Laboratory Co., Ltd: purity 4N) and ZnO (manufactured by Nippon Rare Metal, Inc: purity 4N) were used.

These raw materials were weighed and then mixed and pulverized by means of an agitator bead mill with a wet medium. As the medium for the agitator bead mill with a wet medium, zirconia beads having a diameter of 1 mm were used.

After mixing and pulverizing, the resulting mixture was dried by means of a spray dryer, and put in a mold, and pressed at a surface pressure of 2200 kgf/cm$^2$ with being kept for 5 minutes using a cold press machine to obtain a shaped body.

Thereafter, the shaped body was sintered in an electric furnace. The sintering conditions are as follows.
Heating rate: 2° C./min
Sintering temperature: 1500° C.
Sintering time: 6 hours
Sintering atmosphere: Oxygen flow
Cooling time: 72 hours (2) Preparation of a Sputtering Target After sintering, a sintered body with a thickness of 6 mm was ground and polished into one with a thickness of 5 mm and a diameter of 4 inches. From this sintered body, a sintered body for a sputtering target was cut out. The lateral sides of this sintered body were cut by means of a diamond cutter. The surface was ground by 0.5 mm by means of a plane grinder, whereby a target material having a surface roughness Ra of 0.5 μm or less, a thickness of 5 mm and a diameter of 4 inches was obtained.

Subsequently, the surface of the target material was blown by air, and then ultrasonic cleaning was conducted for 3 minutes every 25 kHz in a frequency range of 25 to 300 kHz by subjecting 12 kinds of frequency to multiplex oscillation.

As a result, a target material was obtained.

Thereafter, the target material was bonded to a backing plate made of oxygen-free copper by means of indium solder, whereby a target was obtained. The target has a surface roughness of Ra≤0.5 μm and a grounded surface with no direction.

The thus produced target was installed in a DC sputtering film forming apparatus. Continuous sputtering was conducted at 100 W for 100 hours in an argon atmosphere of 0.3 Pa, and nodules formed on the surface were counted. As a result, almost no nodules were formed on the target surface. Further, almost no abnormal discharge occurred during the film formation.

For the resulting oxide sintered body (target), the following evaluation was conducted. The results are shown in Table 1.

(A) Atomic Ratio of Metal Elements in the Oxide Sintered Body

The atomic ratio was analyzed by means of an inductively coupled plasma atomic emission spectrometer (ICP-AES, manufactured by Shimadzu Corporation).

(B) Crystal Structure of the Oxide Sintered Body

The crystal structure was judged by the X-ray diffraction measurement (XRD).
Apparatus: "Ultima-III" manufactured by Rigaku Corporation
X-rays: Cu-Kα radiation (wavelength: 1.5406 Å, monochromatized using a graphite monochrometor)
2θ-θ reflection method, continuous scanning (1.0°/min)
Sampling interval: 0.02°
Slit DS, SS: 2/3°, RS: 0.6 mm (C) Properties of a Target (a) Relative Density Relative density was measured by the following formula based on the theoretical density calculated from the density of the raw material powder and the density of the sintered body measured by the Archimedian method.

Relative density=(Density measured by the Archimedian method)/(Theoretical density)×100 (%)

(b) Bulk Resistance

Bulk resistance was measured by the four probe method (JIS R1637) using a resistivity meter (Loresta, manufactured by Mitsubishi Chemical Corporation). The average value of the resistivity values of ten points is taken as the value of resistivity.

(c) Uniformity of Resistance

Uniformity of resistance was measured by the four probe method (JIS R1637) using a resistivity meter (Loresta, manufactured by Mitsubishi Chemical Corporation). From the average value of the resistivity values of ten points and the standard deviation, calculation was made by the following formula:

(Standard deviation)/(Average value)×100 (%)

(d) Number of Pinholes (Average Number of Voids)

After subjecting to mirror polishing of the sintered body in an arbitral direction, the sintered body was etched. The structure was observed by means of a SEM (scanning electron microscope), and the number of voids with a diameter of 1 μm or more per unit area was counted.

(D) Film-Forming Properties of a Target (a) Abnormal Discharge

The number of abnormal discharge occurred in 96 hours was counted.

(b) Particles (Amount of Generated Dust)

The particles were evaluated as follows.

A slide glass was set in a chamber. The density of a particle with a diameter of 1 μm or more which had been attached to the slide glass after 96-hour continuous film formation was measured by means of a microscope.

Evaluation was conducted in ascending order of the number of particles.

$10^4/m^2$ or less: ○

Exceeding $10^4/m^2$: ×

(c) Amount of Nodules (Density of Generated Nodules)

The area of a part covered by nodules was calculated from a photograph of the sputtering target after 96-hour continuous film formation, and the density of generated nodules was calculated by the following formula.

Density of generated nodules=Area of part in which nodules were generated/Area of sputtering target As a result, it was evaluated in ascending order of the amount of nodules.

$10^{-1}$ or less: ○

Exceeding $10^{-1}$: ×

(E) Evaluation of a Thin Film

Using the thus obtained target, a thin film (thickness: 50 nm) was prepared under the following conditions. Electric properties before and after a heat treatment were evaluated.

Film-Forming Conditions

Total pressure: 0.65 Pa

Oxygen partial pressure: Ar: 19.6 sccm, $O_2$: 0.4 sccm

Power: RF 100 W

T-S distance: 100 mm

Substrate temperature: Room temperature (without heating)

Heat Treatment Conditions

By using an oven, a heat treatment was conducted in the atmosphere at 300° C. for one hour.

Measurement of an Electron Carrier Density and Hall Mobility

Measured by means of Resi Test 8310 (Hall measurement apparatus manufactured by Toyo Corporation) (measurement conditions: room temperature (25° C., 0.5 [T], $10^{-4}$ to $10^{-12}$ A, AC magnetic field Hall measurement)

Figure 2:
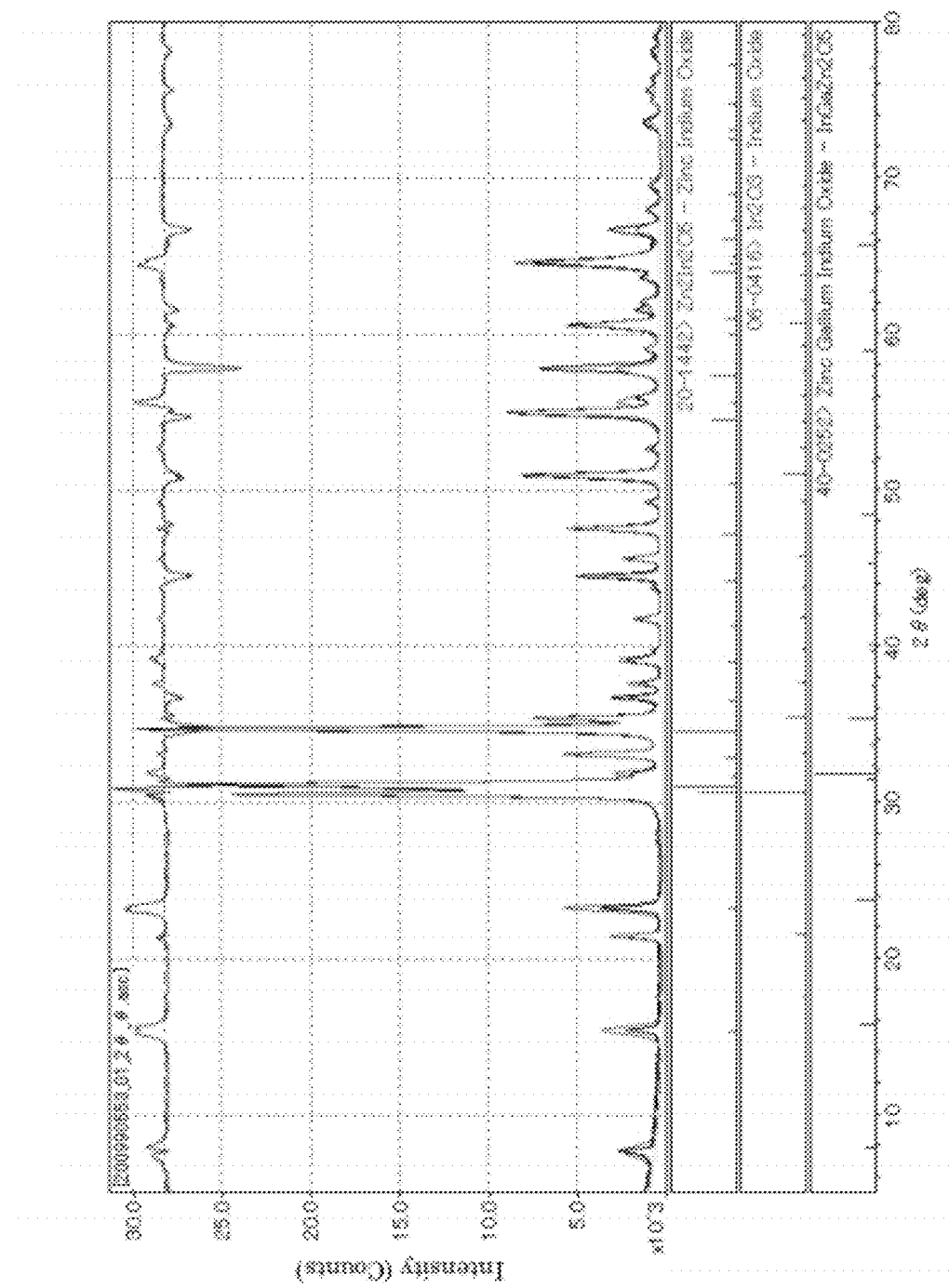
FIG. 2 is an X-ray diffraction chart of an oxide sintered body prepared in Reference Example.

An X-ray diffraction (XRD) chart of the target produced in Example 1 is shown in FIG. 2. For the purpose of comparison, below the XRD chart, the chart of $Zn_2In_2O_5$ (JCPDS: 20-1442) and the chart of $InGaZn_2O_5$ (JCPDS: 40-0252) are shown. From the analysis results of this chart, 5 peaks, i.e. 2θ=7.70°, 31.24°, 34.80°, 55.10° and 57.96°, and it could be confirmed that the target contained oxide A (different from a mixture of $Zn_2In_2O_5$ or $InGaZn_2O_5$). Further, a peak corresponding to a bixbyite structure represented by $In_2O_3$ in the JCPDS card could be confirmed. That is, it could be confirmed that the target was a mixture of a bixbyite structure represented by $In_2O_3$ and Oxide A.

Further, from the peak intensity ratio, the ratio of oxide A to the bixbyite structure represented by $In_2O_3$ was about 5:4.

The elements contained in a thin film obtained by sputtering were analyzed quantitatively by means of an inductively coupled plasma atomic emission spectrometer (ICP-AES). The atomic ratio of In:Ga:Zn was 51:10:39, which was almost equal to that of the target (within ±2% of the atomic ratio of each composition). That is, no significant variation in Ga content was observed.

Examples 2 and 3

Figure 3:
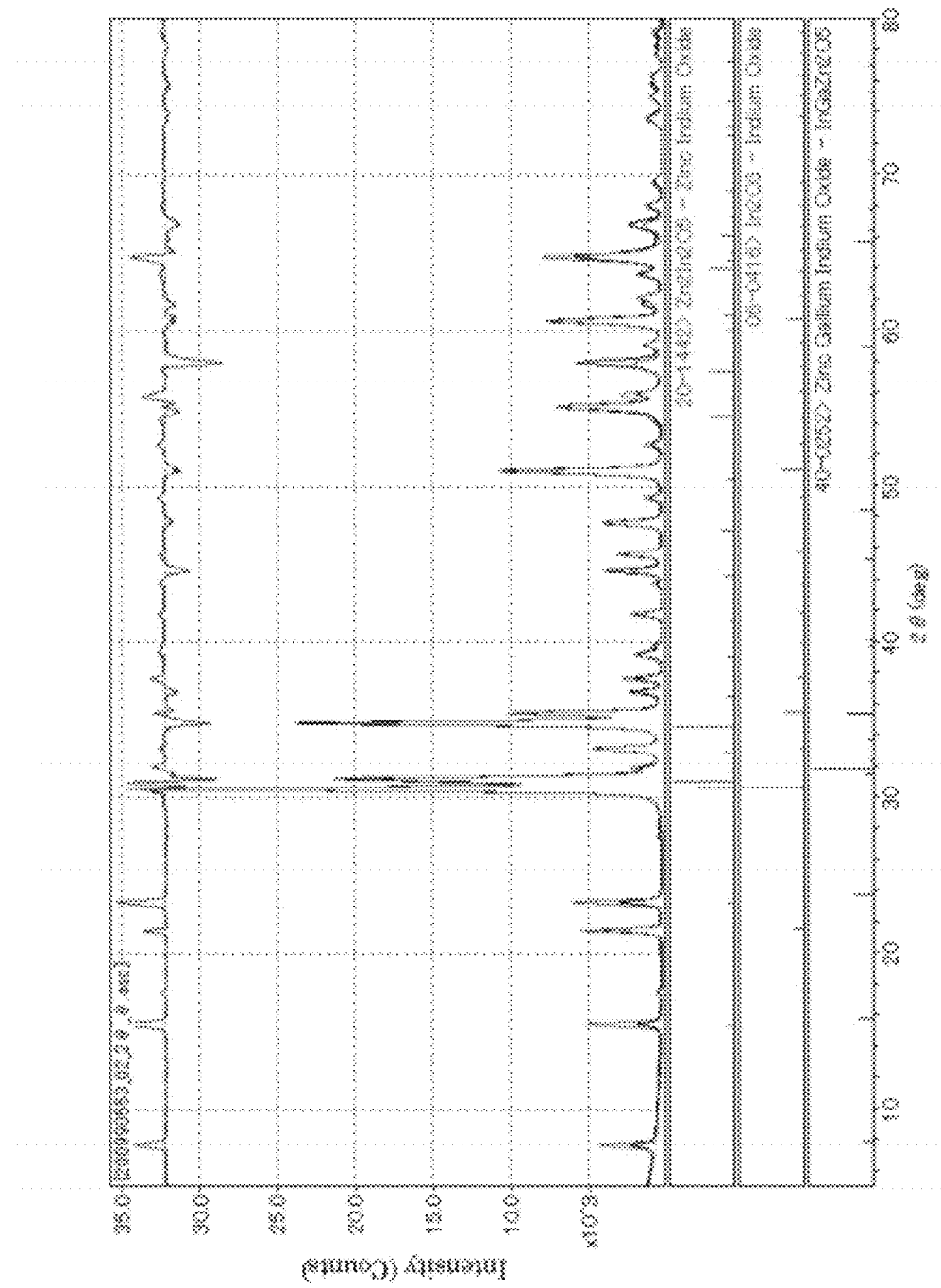
FIG. 3 is an X-ray diffraction chart of an oxide sintered body prepared in Example 1.

Targets were produced and evaluated in the same manner as in Example 1, except that the composition ratio of the raw material was changed to those shown in Table 1. The results are shown in Table 1. An X-ray diffraction chart of the target in Example 2 is shown in FIG. 3.

Reference Example

An oxide sintered body composed of a simple substance of oxide A was prepared. Specifically, an oxide sintered body was prepared in the same manner as in Example 1, except that the composition ratio of the raw material was changed to those shown in Table 1. The resulting target was evaluated. The results are shown in Table 1.

Figure 4:
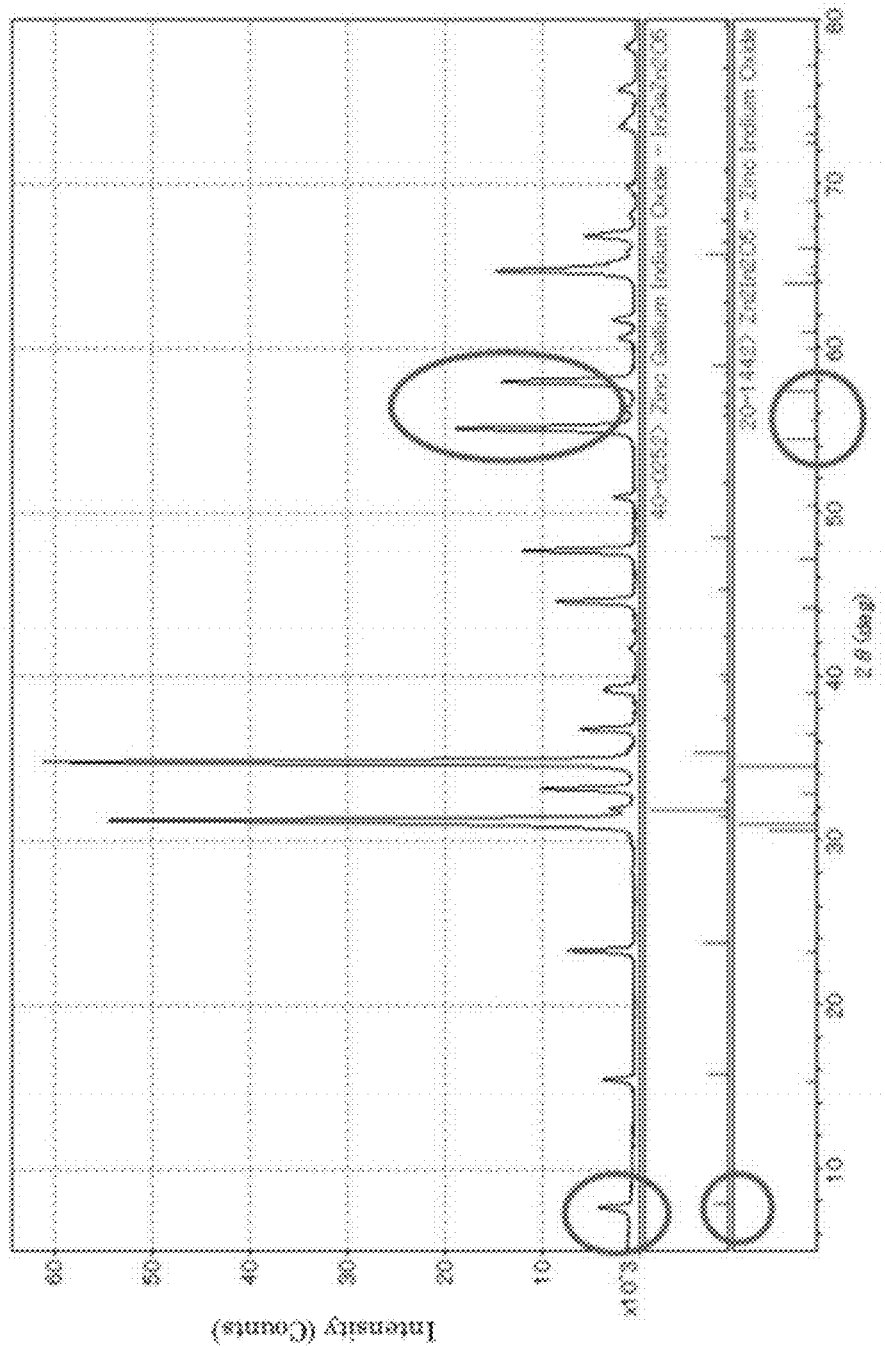
FIG. 4 is an X-ray diffraction chart of an oxide sintered body prepared in Example 2.

An X-ray diffraction (XRD) chart of an oxide sintered body produced in Reference Example is shown in FIG. 4. For the purpose of comparison, below the XRD chart, the chart of $InGaO_3(ZnO)_2$ (JCPDS: 40-0252) and the chart of $In_2O_3(ZnO)_2$ (JCPDS: 20-1442) are shown.

This oxide had a peak specific to $InGaO_3(ZnO)_2$ (indicated by ○ in FIG. 4), a peak specific to $In_2O_3(ZnO)_2$ (indicated by ◯ in FIG. 4) and a peak which is not observed in $InGaO_3(ZnO)_2$ and $In_2O_3(ZnO)_2$. Therefore, this oxide has a novel crystal structure which is different from $InGaO_3(ZnO)_2$ and $In_2O_3(ZnO)_2$.

The sputtering target of the invention contains both oxide A which is a novel crystal and the bixbyite structure represented by $In_2O_3$. As a result, it can be understood that the sputtering target of the invention has a higher sintering density (relative density) and a lower resistance than a target composed only of oxide A. The reason therefor is assumed that, due to the presence of the bixbyite structure in which oxygen deficiency is generated easily, carrier electrons are generated in the target, whereby electricity can pass through a layered structure of novel crystals.

Comparative Example 1

Indium oxide powder (purity 4N) was weighed, and pulverized by means of an agitator bead mill with a wet medium. As the medium for the agitator bead mill with a wet medium, zirconia beads with a diameter of 1 mm φ were used.

After mixing and pulverizing, the resultant was dried by means of a spray drier. The powder thus obtained was filled in a die and pressed by means of a cold pressing machine, whereby a shaped body was produced.

The shaped body thus obtained was sintered at a high temperature of 1200° C. for 4 hours in an oxygen atmosphere while circulating oxygen. As a result, a sintered body 3o for a sputtering target having a relative density of 82.2% was obtained without conducting a pre-firing step.

As a result of an X-ray diffraction, presence of a bixbyite structure represented by $In_2O_3$ in the sintered body was confirmed. This sintered body had a bulk resistance of 2500 mΩcm.

The resulting sputtering target (diameter: 4 inches, thickness: 5 mm) was bonded to a backing plate, and then mounted in a DC sputtering film-forming apparatus. In an argon atmosphere of 0.3 Pa, continuous sputtering was conducted at 100 W for 100 hours, and nodules generated on the surface were observed. As a result, it was admitted that nodules were generated on the almost entire surface of the target.

The thus obtained target was evaluated in the same manner as in Example 1. The results are shown in Table 1.

Comparative Example 2

Indium oxide powder (purity: 4N), gallium oxide powder (purity: 4N) and zinc oxide powder (purity: 4N) were W for 100 hours, and nodules generated on the surface were observed. As a result, nodules were generated on almost the half surface of the target.

The thus obtained target was evaluated in the same manner as in Example 1. The results are shown in Table 1.

Comparative Example 3

A target was produced and evaluated in the same manner as in Comparative Example 2, except that the composition ratio was changed to that shown in Table 1. The results are shown in Table 1.

TABLE 1

|  |  | Reference Example | Example 1 | Example 2 | Example 3 | Comparative Example 1 | Comparative Example 2 | Comparative Example 3 |
|---|---|---|---|---|---|---|---|---|
| Composition of target (atomic ratio) | In/(In + Ga + Zn) | 0.37 | 0.50 | 0.55 | 0.60 | 1.00 | 0.25 | 0.45 |
|  | Ga/(In + Ga + Zn) | 0.13 | 0.10 | 0.10 | 0.10 | 0.00 | 0.50 | 0.55 |
|  | Zn/(In + Ga + Zn) | 0.50 | 0.40 | 0.35 | 0.30 | 0.00 | 0.25 | 0.00 |
|  | Ga/(In + Ga) | 0.26 | 0.17 | 0.15 | 0.14 | 0.00 | 0.67 | 0.55 |
| Crystals of target*[1] | $In_2O_3$ JCPDS card No. 06-0416 | — | ② | ① | ① | ① | — | — |
|  | $ZnGa_2O_4$ JCPDS card No. 38-1240 | — | — | — | — | — | ① | ① |
|  | Oxide A Not found in JCPDS card | ① | ① | ② | ② | — | — | — |
| Properties of target | Relative density (%) | 95 | 97 | 98 | 98 | 82 | 91 | 84 |
|  | Bulk resistance (m Ω cm) | 4 | 2 | 1 | 1 | 2500 | 150 | 210 |
|  | Uniformity of resistance | <5% | <5% | <5% | <5% | 25% | 20% | 20% |
|  | Number of pinholes (pinholes/mm$^2$) | <10 | <10 | <10 | <10 | 40 | 30 | 30 |
| Film forming properties of target | Abnormal discharge (times/96 hours) | <10 | <10 | <10 | <10 | 50 | 35 | 35 |
|  | Particles | ○ | ○ | ○ | ○ | X | X | X |
|  | Nodules | ○ | ○ | ○ | ○ | X | X | X |
| Thin film properties | Before heat treatment Carrier density | $3 \times 10^{17}$ | $1 \times 10^{19}$ | $2 \times 10^{19}$ | $3 \times 10^{19}$ | $2 \times 10^{20}$ | $<1 \times 10^{15}$ | $<1 \times 10^{15}$ |
|  | Hall mobility (cm$^2$/Vs) | 15 | 26 | 30 | 33 | 40 | <1 | <1 |
|  | Results of XRD | Amorphous | Amorphous | Amorphous | Amorphous | Amorphous | Amorphous | Amorphous |
|  | After heat treatment Carrier density | $1 \times 10^{17}$ | $3 \times 10^{19}$ | $3 \times 10^{19}$ | $4 \times 10^{19}$ | $1 \times 10^{20}$ | $<1 \times 10^{15}$ | $<1 \times 10^{15}$ |
|  | Hall mobility (cm$^2$/Vs) | 10 | 27 | 30 | 30 | 90 | <1 | <1 |
|  | Results of XRD | Amorphous | Amorphous | Amorphous | Amorphous | Crystalline | Amorphous | Amorphous |

*[1]
"—" indicates that no XRD pattern could be confirmed.
① indiates that it is a main component crystal, and ② indicates that this is a secondary component.

weighed such that the weight ratio of $In_2O_3$:$Ga_2O_3$:ZnO became 34:46:20, and mixed and pulverized by means of an agitator bead mill with a wet medium. As the medium for the stirring mill with a wet medium, zirconia beads with a diameter of 1 mm φ were used.

After mixing and pulverizing, the resultant was dried by means of a spray drier. The mixed powder thus obtained was filled in a die and pressed by means of a cold pressing machine, whereby a shaped body was produced.

The shaped body thus obtained was sintered at a high temperature of 1200° C. for 4 hours in an oxygen atmosphere while circulating oxygen. As a result, a sintered body for an IGZO sputtering target having a relative density of 90.8% (sintered body density: 5.85 g/cm$^3$) was obtained without conducting a pre-firing step.

As a result of an X-ray diffraction, presence of crystals of $ZnGa_2O_4$ in the sintered body was confirmed. However, $InGaZn_4$ was not observed. This sintered body had a bulk resistance of 150 mΩcm.

The resulting sputtering target (diameter: 4 inches, thickness: 5 mm) was bonded to a backing plate, and then mounted in a DC sputtering film-forming apparatus. In an argon atmosphere of 0.3 Pa, continuous sputtering was conducted at 100

[Production and Evaluation of a TFT]

By using the sputtering targets prepared in Examples 1 to 3 and Reference Example, bottom gate field effect transistors were prepared.

The sputtering target was mounted in a film-forming apparatus of the RF magnetron sputtering method, which is one of the sputtering methods. A 15 nm-thick channel layer (semiconductor layer) was formed on a silicon substrate provided with a thermally oxidized film (100 nm). The same sputtering conditions as those in the above-mentioned thin film formation were used. By photolithography, a semiconductor region (so-called "island") was formed.

Subsequently, a substrate with a semiconductor was heat-treated in the air at 300° C. for 0.5 hour.

For conducting lift-off, a photoresist material was applied to form a photoresist film. Thereafter, a metal thin film which would become a source electrode and a drain electrode was formed. The metal thin film was formed by stacking Ti, Au and Ti sequentially by DC sputtering. After the metal thin film was formed, the film was patterned by lift-off, whereby a source electrode and a drain electrode were formed.

Thereafter, the substrate provided with the metal thin film was again subjected to a heat treatment in the air at 300° C. for one hour, whereby a bottom gate field effect transistor in which an Si substrate was used as a gate electrode with a dimension of W of 30 μm and L of 30 μm was produced.

A field effect transistor in which the thickness of the semiconductor layer was 40 nm was similarly produced.

The following evaluation was conducted for the thus obtained field effect transistor. The results are shown in Table 2.

(1) Field Effect Mobility (μ), S Value, Threshold Voltage (Vth)

The field effect mobility (μ), the S value and the threshold voltage (Vth) were measured by means of a semiconductor parameter analyzer (4200, manufactured by Keithley Instruments, Inc.) under dry nitrogen atmosphere at an atmospheric pressure at room temperature in a light-shielding environment.

(2) Measurement of Thickness

The thickness was measured by means of a film thickness gauge (ET3000 manufactured by Kosaka Laboratory).

The results are shown in Table 2.

TABLE 2

| Evaluation of thin film transistor | | Ref. Ex. | Examples | | |
|---|---|---|---|---|---|
| | | | 1 | 2 | 3 |
| Film thickness of semiconductor layer 15 nm | Field effect mobility (cm²/Vs) | 25 | 36 | 38 | 40 |
| | S value (V/decade) | 0.2 | 0.1 | 0.1 | 0.1 |
| | Threshold voltage (V) | 4.3 | 2.3 | 1.8 | 1.3 |
| Film thickness of semiconductor layer 40 nm | Field effect mobility (cm²/Vs) | 23 | 28 | 30 | 31 |
| | S value (V/decade) | 0.2 | 0.3 | 0.3 | 0.3 |
| | Threshold voltage (V) | 0.8 | −2.3 | −3.2 | −4.8 |

INDUSTRIAL APPLICABILITY

The sputtering target of the invention can be used suitably for forming an oxide thin film. The oxide thin film is used in a semiconductor layer or the like of a thin film transistor, for example.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. A sputtering target comprising oxide A shown below and indium oxide ($In_2O_3$) having a bixbyite crystal structure:

Oxide A: an oxide which comprises an indium element (In), a gallium element (Ga) and a zinc element (Zn) in which diffraction peaks are observed at positions corresponding to incident angles (2θ) of 7.0° to 8.4°, 30.6° to 32.0°, 33.8° to 35.8°, 53.5° to 56.5° and 56.5° to 59.5° in an X-ray diffraction measurement (CuKα rays).

2. The sputtering target according to claim 1, wherein the atomic ratio of an indium element (In), a gallium element (Ga) and a zinc element (Zn) satisfies the following formulas (1) and (2):

$$0.10 \leq Zn/(In+Ga+Zn) \leq 0.45 \quad (1)$$

$$0.05 < Ga/(In+Ga+Zn) < 0.18 \quad (2).$$

3. The sputtering target according to claim 2, wherein the atomic ratio of an indium element (In) and a gallium element (Ga) satisfies the following formula (3):

$$0.14 \leq Ga/(In+Ga) \quad (3).$$

4. The sputtering target according to claim 3, wherein all mental elements contained consist essentially of In, Ga and Zn.

5. An oxide thin film produced by using the sputtering target according claim 3.

6. The sputtering target according to claim 2, wherein all mental elements contained consist essentially of In, Ga and Zn.

7. An oxide thin film produced by using the sputtering target according claim 6.

8. The sputtering target according to claim 2 which has a resistance of 10 mΩcm or less and a relative density of 95% or more.

9. An oxide thin film produced by using the sputtering target according claim 2.

10. The sputtering target according to claim 1, wherein the atomic ratio of an indium element (In) and a gallium element (Ga) satisfies the following formula (3):

$$0.14 \leq Ga/(In+Ga) \quad (3).$$

11. The sputtering target according to claim 10, wherein all mental elements contained consist essentially of In, Ga and Zn.

12. An oxide thin film produced by using the sputtering target according claim 11.

13. The sputtering target according to claim 10 which has a resistance of 10 mΩcm or less and a relative density of 95% or more.

14. An oxide thin film produced by using the sputtering target according claim 10.

15. The sputtering target according to claim 1, wherein all mental elements contained consist essentially of In, Ga and Zn.

16. The sputtering target according to claim 15 which has a resistance of 10 mΩcm or less and a relative density of 95% or more.

17. An oxide thin film produced by using the sputtering target according claim 15.

18. The sputtering target according to claim 1 which has a resistance of 10 mΩcm or less and a relative density of 95% or more.

19. An oxide thin film produced by using the sputtering target according claim 18.

20. An oxide thin film produced by using the sputtering target according to claim 1.

* * * * *